United States Patent
Alam et al.

(10) Patent No.: US 10,304,511 B1
(45) Date of Patent: May 28, 2019

(54) DUAL-EDGE TRIGGER ASYNCHRONOUS CLOCK GENERATION AND RELATED METHODS

(71) Applicant: Everspin Technologies Inc., Chandler, AZ (US)

(72) Inventors: Syed M. Alam, Austin, TX (US); Yaojun Zhang, Austin, TX (US); Thomas Andre, Austin, TX (US)

(73) Assignee: Everspin Technologies Inc., Chandler, AZ (US)

( * ) Notice: Subject to any disclaimer, the term of this patent is extended or adjusted under 35 U.S.C. 154(b) by 0 days.

(21) Appl. No.: 15/959,669

(22) Filed: Apr. 23, 2018

(51) Int. Cl.
*G11C 11/16* (2006.01)
*H03K 5/1534* (2006.01)
*H03K 5/00* (2006.01)

(52) U.S. Cl.
CPC ...... *G11C 11/1693* (2013.01); *G11C 11/1673* (2013.01); *G11C 11/1675* (2013.01); *H03K 5/1534* (2013.01); *H03K 2005/00019* (2013.01)

(58) Field of Classification Search
CPC ............ G11C 11/1693; G11C 11/1673; G11C 11/1675; H03K 5/1534; H03K 2005/00019
See application file for complete search history.

(56) References Cited

U.S. PATENT DOCUMENTS

| | | | |
|---|---|---|---|
| 8,355,272 | B2 | 1/2013 | Andre |
| 8,923,041 | B2 | 12/2014 | Andre et al. |
| 9,286,218 | B2 | 3/2016 | Andre et al. |
| 9,472,256 | B1 * | 10/2016 | Andre ................. G11C 11/1675 |
| 2009/0323403 | A1 | 12/2009 | Chen et al. |
| 2011/0292714 | A1 | 12/2011 | Andre et al. |

OTHER PUBLICATIONS

Cargnini, Luis Vitorio et al., "Embedded Memory Hierarchy Exploration Based on Magnetic Random Access Memory," Journal of Low Power Electronics and Applications, Aug. 28, 2014, pp. 214-230, vol. 4.

* cited by examiner

*Primary Examiner* — David Lam
(74) *Attorney, Agent, or Firm* — Bookoff McAndrews, PLLC (57) ABSTRACT

The present disclosure is drawn to, among other things, a magnetoresistive memory. The magnetoresistive memory comprises a first memory cell, a first clock-generating circuit, and a second clock-generating circuit. The first clock-generating circuit is configured to provide a first output signal and a second output signal. The second clock-generating circuit is configured to provide a third output signal and a fourth output signal. The first output signal, the second output signal, the third output signal, and the fourth output signal are configured for controlling access operations for the first memory cell.

20 Claims, 9 Drawing Sheets

DUAL-EDGE TRIGGER ASYNCHRONOUS CLOCK GENERATION AND RELATED METHODS

TECHNICAL FIELD

This disclosure relates generally to magnetic memory devices having, e.g., two select devices and two magnetic tunnel junctions in each memory cell of a memory array, and more particularly, to circuits and methods for generating asynchronous clock signals for accessing the memory cells of a memory array during read and/or write operations.

INTRODUCTION

Static Random Access Memory (SRAM) is a commonly employed semiconductor in the design of on-chip processor memory (e.g., embedded memory). However, Magnetic Random Access Memory (MRAM) is an emerging technology with potential to replace SRAM as embedded memory. Spin-torque (ST), or Spin-Transfer-Torque (STT) MRAM devices are well suited for embedded-memory applications because they scale at greater densities and consume lower leakage current compared to SRAM.

Spin-torque MRAM devices store information by controlling the resistance across a magnetic tunnel junction (MTJ) such that a read current through the MTJ results in a voltage drop having a magnitude that is based on the state of the MTJ stack. The resistance in each MTJ can be varied based on the relative magnetic states of the magnetoresistive layers within the MTJ stack. In such memory devices, there is typically a portion of the MTJ stack that has a "fixed" magnetic state and another portion that has a "free" magnetic state that is controlled to be in either of two possible states relative to the portion having the "fixed" magnetic state. A dielectric tunnel barrier may be disposed in between the portions having the "fixed" and "free" magnetic states. Because the resistance through the MTJ changes based on the orientation of the "free" portion relative to the "fixed" portion, information can be stored by setting the orientation of the "free" portion. The information is later retrieved by sensing the orientation of the "free" portion.

Data stored in memory is defined in banks. A rank is a plurality of banks in a first direction (e.g., column) and a channel is a plurality of banks in a second direction (e.g., row). A process for accessing the memory comprises several clock cycles required for row and column identification and for read and/or write operations. Access to a bank in conventional double data rate (DDR) memory generally includes an ACTIVATE operation, followed by READ/WRITE operations and a PRECHARGE operation. However, in embedded-MRAM applications, READ and/or WRITE operations may occur back-to-back without the overhead of ACTIVATE or PRECHARGE operations.

BRIEF DESCRIPTION OF THE DRAWINGS

In the course of the detailed description that follows, reference will be made to the appended drawings. The drawings show different aspects of the present disclosure and, where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

Moreover, there are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

As used herein, the terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. The term "exemplary" is used in the sense of "example," rather than "ideal."

DETAILED DESCRIPTION

Detailed illustrative aspects are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of exemplary embodiments described herein.

When the specification makes reference to "one embodiment" or to "an embodiment," it is intended to mean that a particular feature, structure, characteristic, or function described in connection with the embodiment being discussed is included in at least one contemplated embodiment of the present disclosure. Thus, the appearance of the phrases, "in one embodiment" or "in an embodiment," in different places in the specification does not constitute a plurality of references to a single embodiment of the present disclosure.

As used herein, the singular forms "a," "an," and "the" are intended to include the plural forms as well, unless the context clearly indicates otherwise. It also should be noted that in some alternative implementations, the features and/or steps described may occur out of the order depicted in the figures or discussed herein. For example, two steps or figures shown in succession may instead be executed substantially concurrently or may sometimes be executed in the reverse order, depending upon the functionality/acts involved.

In the interest of conciseness, conventional techniques, structures, and principles known by those skilled in the art may not be described herein, including, for example, standard Magnetic Random Access Memory (MRAM) process techniques, generation of bias voltages, fundamental principles of magnetism, and basic operational principles of memory devices.

During the course of this description, like numbers may be used to identify like elements according to the different figures that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in or otherwise contemplated with respect to an embodiment of described the subject matter.

Embodiments of the present disclosure related to, among other things, circuitry configured to generate asynchronous clock signals configured to enable back-to-back operations or accesses (e.g., reading and/or writing) of data to memory cells in MRAM applications, such as, e.g., embedded-MRAM applications. The various embodiments presented herein are based on a magnetic memory device architecture that includes two MTJs and two corresponding select devices (e.g., access transistor) in each memory cell. This may be referred to as a 2T2MTJ memory (or differential MTJ memory) device. Because the resistance through different magnetic tunnel junctions can vary significantly, the two magnetic tunnel junctions in the memory cell are written to complementary states to store a single bit of information. The bit stored in the memory cell can be readily determined by comparing the states of the two magnetic tunnel junctions. This can be more reliable and faster than comparing the resistance of a single MTJ memory cell with a reference resistance. In one example of a 2T2MTJ memory cell storing a bit having the value "0", the first magnetic tunnel junction is in the first state (e.g. a relatively lower resistance), and the second magnetic tunnel junction is in the second state (e.g. a relatively higher resistance). If the first magnetic tunnel junction is in the second state (e.g. a relatively higher resistance) and the second magnetic tunnel junction is in the first state (e.g. a relatively lower resistance), that can represent the memory cell storing a "1." The complementary storage yields more read-signal margin and faster speeds by comparing the resistance differential.

As discussed in more detail below, circuits and techniques for generating asynchronous clock signals are presented for enabling back-to-back operations in embedded-MRAM devices. The embedded-MRAM device may include 2T2MTJ memory cells and may perform back-to-back accesses (without the overhead of e.g., ACTIVATE or PRE-CHARGE commands) when retrieving and/or storing data in the 2T2MTJ memory cells.

Figure 1:
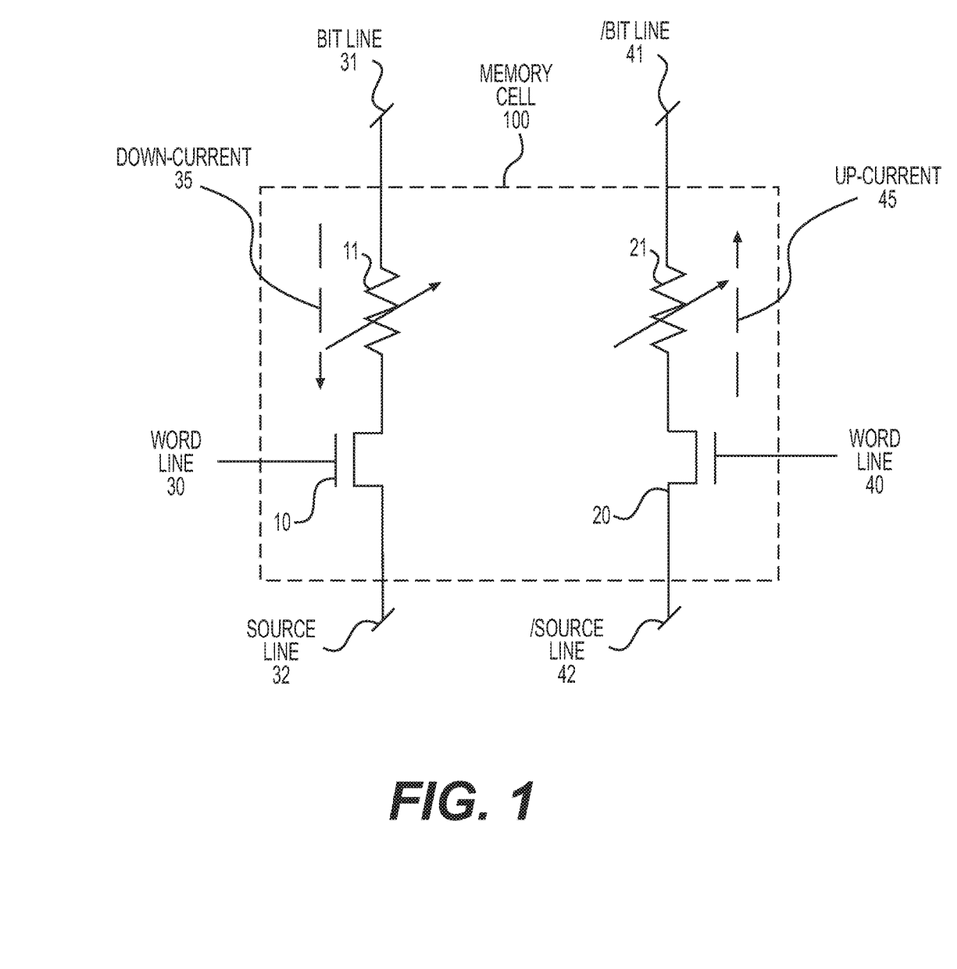
FIG. 1 depicts a schematic diagram of a two-transistor two-magnetic tunnel junction (2T2MTJ) memory cell, according to one aspect of the present disclosure.

With reference now to FIG. 1, there is depicted a 2T2MTJ memory cell 100. Memory cell 100 includes a first MTJ 11 coupled in series with a first select device 10 as well as a second MTJ 21 coupled in series with a second select device 20. Each MTJ 11, 12 is coupled to a corresponding select device 10, 20 to allow each MTJ to be individually selected for access. The MTJ 11 and select device 10 are coupled in series between a bit line 31 and a source line 32. The bit line 31 and the source line 32 allow for different currents or voltages to be applied to the series circuit formed by the MTJ 11 and select device 10. Similarly, MTJ 12 and select device 20 are coupled in series between /bit line 41 ("bit line bar") and /source line 42 ("source line bar"). In other embodiments, the signal lines used to provide the various voltages and currents to the MTJs may be referred to by names other than "source line" and "bit line." In the present disclosure, the lines used to apply the voltage/current to the MTJs are referred to as "common lines," "bit lines," and "source lines" in order to promote a better understanding of the various embodiments disclosed herein.

As noted above, in a 2T2MTJ memory cell, a single data bit is stored by storing complementary states in the two MTJs included in the memory cell. For a read operation, the resistance across MTJ 11 is detected and compared with the resistance across MTJ 21. In some embodiments, this is accomplished by applying a voltage at each of bit line 31 and /bit line 41 while pulling the source line 32 and /source line 42 to a lower voltage (e.g., ground). In other embodiments, a matched current source may be used to apply a known current through each MTJ 11, 21. The resulting currents from the voltage applied across the MTJs can be compared to determine which MTJ has the relatively higher or larger resistance. Similarly, for embodiments that drive a matched current through the MTJs, the voltage drop across each of the two magnetic tunnel junctions can be compared to determine the bit stored in the memory cell.

Word lines 30 and 40, which are coupled to the gates of select devices 10 and 20, respectively, are used to control access to the MTJs and 11 and 21. When the gates of the select devices (e.g., select devices 10 and 20) are driven high, current is allowed to flow through the MTJs 11 and 21. For a read operation, each of word lines 30, 40 may be driven to the same voltage level such that the voltage/current through each of the MTJs 11, 21 is presented with the same biasing with respect to the select devices 10, 20, thereby enabling an accurate comparison of the states of the two MTJs 11, 21. The comparison of the states of the two MTJs 11, 21 may be performed by a read circuit, where one example of such a read circuit may include a sense amplifier configured to sense the difference between the two states and determine the single bit represented by those stored states. Because MTJs 11, 21 may store complementary states, the comparison may involve determining whether one of the MTJs (e.g., MTJ 11) is in a relatively "higher" resistance state than the other MTJ (e.g., MTJ 21). As such, the magnitude of the resistance difference may be relatively less important than in other non-2T2MTJ memory devices.

In a spin-torque magnetic memory, writing a state to MTJs 11, 21 may be accomplished by sending a spin-polarized write current through the MTJs 11, 21 where the angular momentum carried by the spin-polarized current can change the magnetic state of the free portion. One of ordinary skill in the art understands that such a current can either be directly driven through the MTJs or can be the result of applying one or more voltages across the magnetic tunnel junction, where the applied voltages result in the desired current. Depending on the direction of the current through the MTJ, the resulting magnetization of the free portion will either be the first state or the second state. In such memories, the magnitude of the write current is typically greater than the magnitude of a read current used to sense the information stored in the memory cells. In the case of a two-magnetic tunnel junction memory cell, storing a bit in the memory cell requires two opposite currents to be passed through the two MTJs in order to store the two different states in those MTJs.

In the example illustrated in FIG. 1, a down-current 35 is sent through the MTJ 11, whereas an up-current 45 is sent through the MTJ 21. Thus, in the example illustrated, the MTJ 11 is being written to the low resistance state, whereas the MTJ 21 is being written to the higher resistance state. In other embodiments, a down-current write can correspond to storing a higher resistance state and an up-current write can correspond to storing a lower resistance state.

Figure 2:
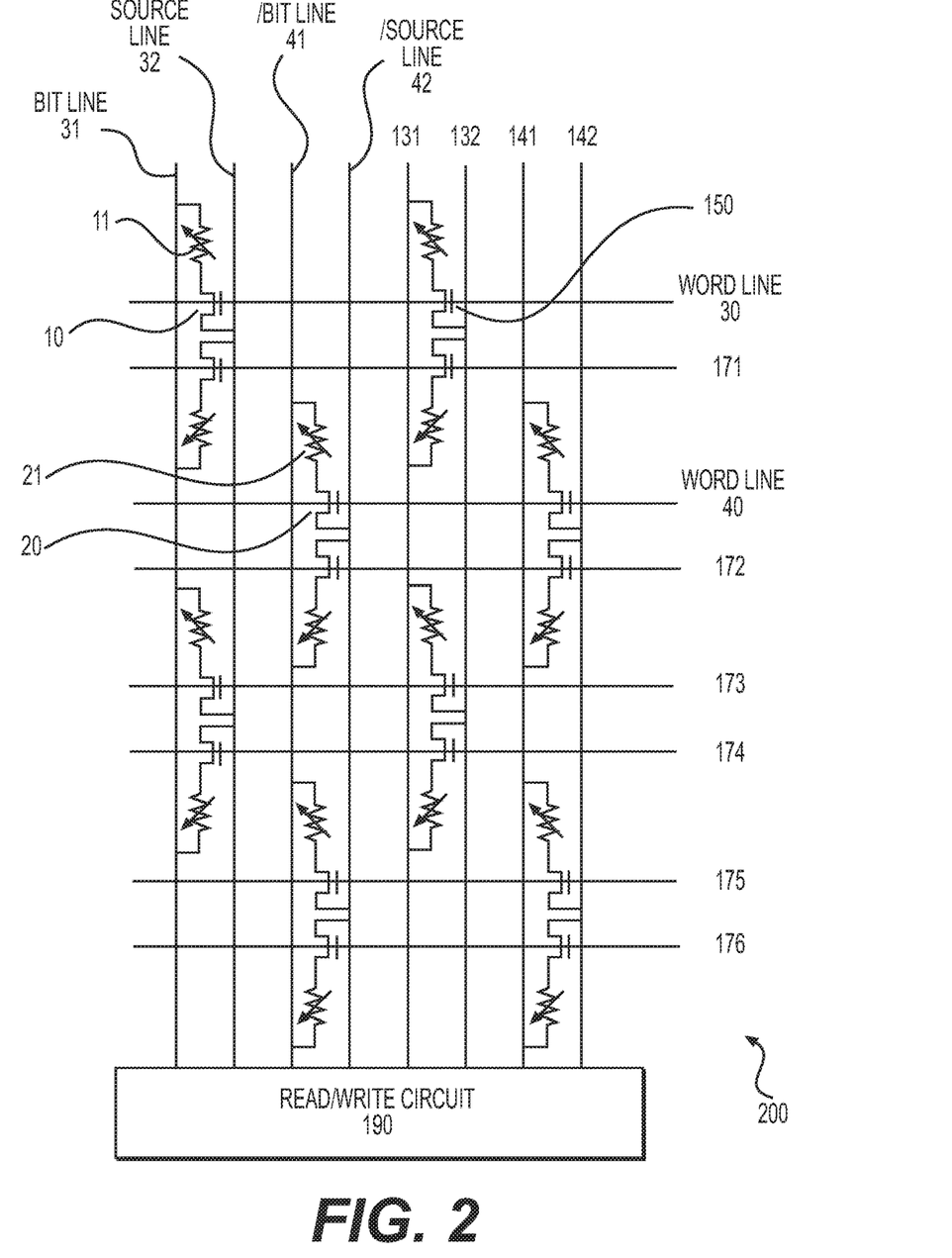
FIG. 2 depicts a schematic diagram of a portion of a magnetic memory device that includes 2T2MTJ memory cells, according to another aspect of the present disclosure.

With reference now to FIG. 2, there is a schematic diagram of a portion of a magnetic memory device 200 that includes a plurality of 2T2MTJ memory cells, including e.g., the memory cell 100 of FIG. 1. As shown, a first half of the memory cell 100 includes MTJ 11 and select device 10 coupled between bit line 31 and source line 32. The gate of select device 10 is coupled to word line 30. As shown, additional MTJs and select devices may be coupled to bit line 31, source line 32, and word line 30. However, by controlling the respective voltages on bit lines, source lines, and word lines, each MTJ in the array can be individually selected for read and/or write operations. Read/write circuit 190 may include the drivers to drive the bit and source lines as well as the read circuitry used to determine the states of the MTJs and resulting data bits stored in the memory cells.

The complementary half of memory cell 100 includes MTJ 21 and select device 20, which are coupled in series between /bit line 41 and /source line 42. Word line 40 is coupled to the gate of the select device 20. FIG. 2 illustrates a total of eight memory cells arranged in four columns, where the first half of each memory cell is included in a column neighboring the second half of the memory cell. Thus, the select device 10 is included in a first plurality of select devices in the first column, all of which may be coupled to source line 32. The select device 20 is included in a second plurality of select devices in the second column, all of which may be coupled to /source line 42. The neighboring columns can be labeled as even/odd columns, where one select device for each memory cell is included in an even column and the other is included in an odd column.

In an example operation, the single bit stored in the memory cell 100 can be determined during a read operation by comparing the states of MTJs 11 and 21. In order to perform the comparison, the read/write circuit 190 selectively drives bit line 31, source line 32, /bit line 41, and /source line 42. The bit lines and source lines that are actually driven is based on address information received by the memory device, where the address information is decoded and used to determine which cells are to be accessed. If the memory cell 100 is included in the page to be accessed, the read/write circuit 190 will use the decoded address to selectively drive the bit lines and source lines that need to be driven/monitored to determine the states of magnetic tunnel junctions 11 and 21. In FIG. 2, the bit line 31 and source line 32 pair is shown in neighboring proximity to the /bit line 41 and /source line 42 pair. However, in an alternative embodiment, the respective lines for each of the pairs may be located in different segments or locations of the array. The true bit of 2T2MJ may be located in a first segment of the array while the complement bit may located in a different segment of the array. This would allow for a more flexible and compact configuration in which MTJs are arranged in every wordline row and column.

Figure 3:
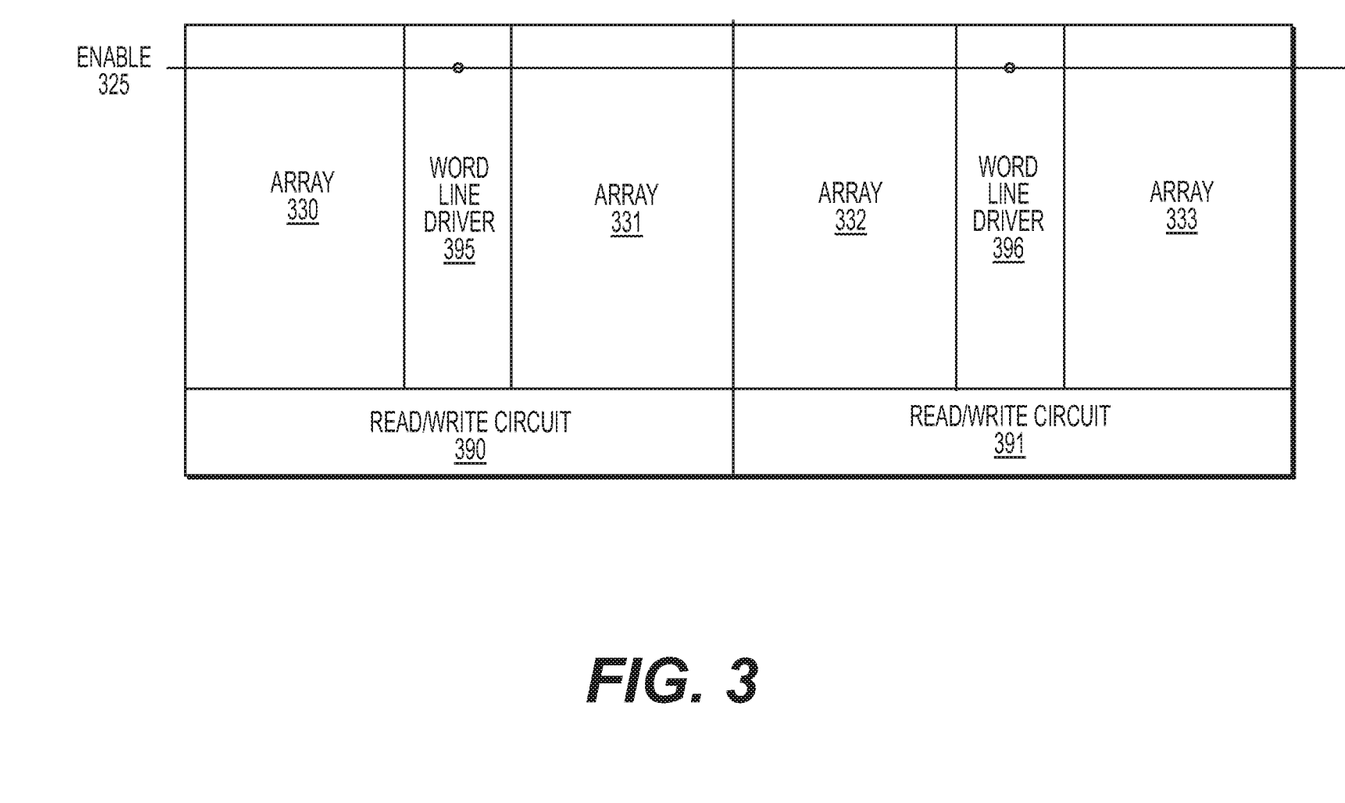
FIG. 3 depicts a block diagram of a portion of a magnetic memory device that includes 2T2MTJ memory cells, according to another aspect of the present disclosure.

FIG. 3 illustrates a block diagram of a portion of a magnetic memory device that includes a plurality of read/write circuits 390, 391. Read/write circuit 390 may be coupled to arrays 330 and 331 and provides the appropriate voltages on any bit lines and source lines used to perform read/write operations in the arrays 330 and 331. Word line driver 395 receives enable signal 325 and generates the appropriate word line voltages for the arrays 330 and 331 used for the read/write operations. Read/write circuit 391, arrays 332, 333, and word line driver 396 are similar to read/write circuit 390, arrays 330, 331, and word line driver 395.

Word line drivers 395 and 396 receive enable signal 325, which may be a global decode signal corresponding to higher-order address bits received by the memory device. The enable signal 325 provides an indication as to whether memory cells included in a portion of arrays 330-333 are to be accessed for a particular operation. Additional address signals are provided to circuitry that includes the word line drivers 395, 396 and read/write circuits 390, 391 to, e.g., allow for local decoding that determines which word lines, bit lines, and source lines are to be driven for a particular operation. The local decoding controls the selective driving of the bit lines and source lines in the respective arrays by the read/write circuits 390, 391, as well as controlling the selective coupling of one or more sense amplifiers to, or sensing of, the memory cells in the arrays 330-333, for determination of data bits stored therein.

Figure 4A:
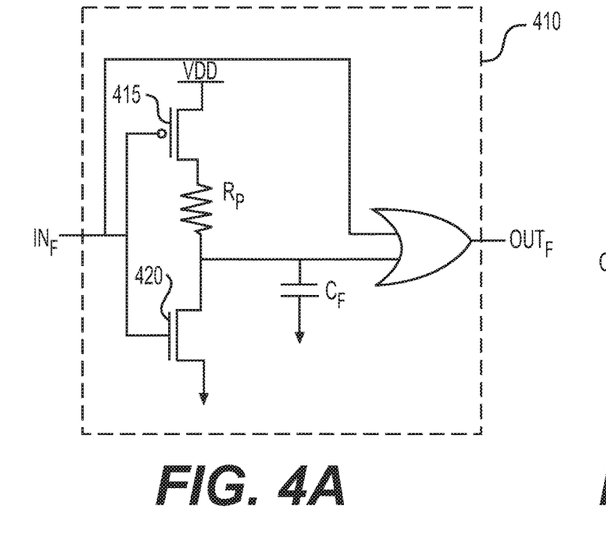
FIG. 4A depicts a schematic diagram of a falling-edge trigger delay cell, according to another aspect of the present disclosure.
Figure 4B:
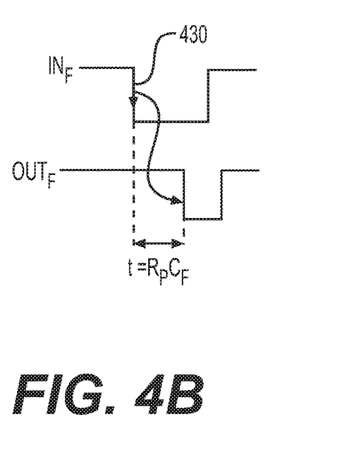
FIG. 4B depicts an example timing diagram of a falling-edge triggered delayed output signal, according to another aspect of the present disclosure.

Asynchronous timing signals for controlling the operations of the magnetic memory device (such as, e.g., enable signal 325 and other decoding control signals) may be generated from edge-triggered delay cells to offset input clock signals. In some embodiments, asynchronous timing signals may be defined as timing signals in which one operation begins upon receipt of an indication that a preceding operation has been completed. In FIG. 4A, for example, a falling-edge delay cell 410 offsets an input signal $IN_F$ to generate output signal $OUT_F$. FIG. 4B is a corresponding timing diagram illustrating how output signal $OUT_F$ may be offset from a falling edge of input signal $IN_F$ (430) by a time delay $t=xR_PC_F$, where $R_P$ is a resistance value of a resistor coupled to the drain of PMOS transistor 415, $C_F$ is a capacitance value of a capacitor coupled to the drain of NMOS transistor 420, and x is a constant. Thus, time delay t is proportional to the product of the resistance value and the capacitance value (e.g., RC). It is to be appreciated that for the sake of simplicity, time delay t will be denoted as t=RC in the rest of the description and figures.

Figure 4C:
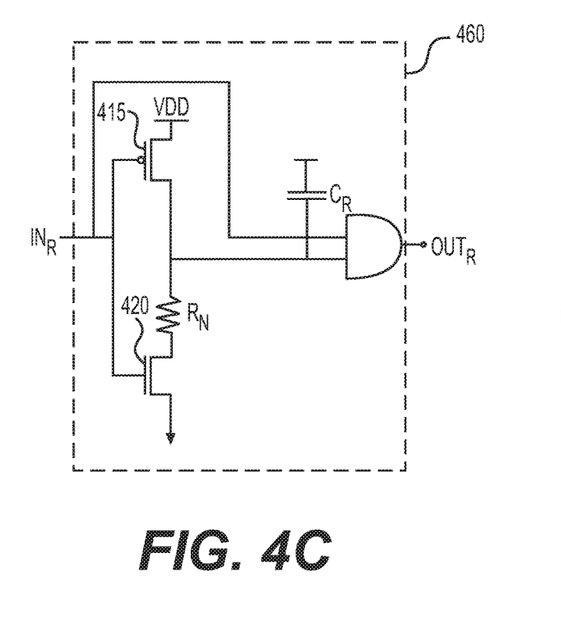
FIG. 4C depicts a schematic diagram of a rising-edge trigger delay cell, according to another aspect of the present disclosure.
Figure 4D:
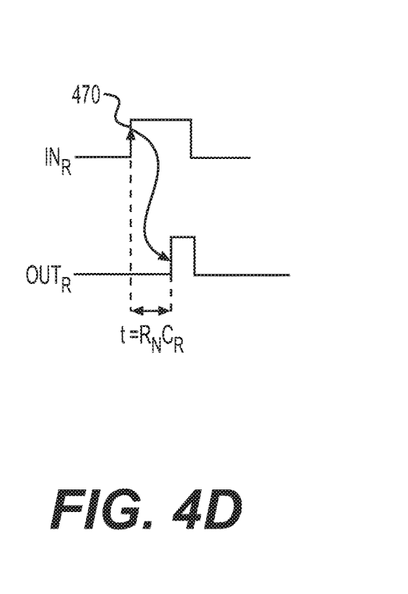
FIG. 4D depicts an example timing diagram of a rising-edge triggered delayed output signal, according to another aspect of the present disclosure.

In other cases, asynchronous timing signals for controlling the operations of the magnetic memory device may be generated from rising-edge trigger delay cells to offset input clock signals. In FIG. 4C, for example, a rising-edge delay cell 460 offsets an input signal $IN_R$ to generate output signal $OUT_R$. FIG. 4D is a corresponding timing diagram illustrating how output signal $OUT_R$ is offset from the rising edge of input signal $IN_R$ (470) by a time delay $t=R_NC_R$, where $R_N$ is a resistance value of a resistor coupled to the drain of NMOS transistor 420, and $C_R$ is a capacitance value of a capacitor coupled to the drain of PMOS transistor 415.

In each of the edge-trigger delay cells (e.g., falling-edge delay cell 410 and rising-edge delay cell 460), the capacitors need to either discharge (or pre-charge) after the non-triggering edges of the respective input signals, in order to reach the desired offset time delays (e.g., t=RC). For example, capacitor $C_F$ in falling-edge trigger delay cell 410 needs to be discharged after the non-triggering edge of input signal $IN_F$ (e.g., after the rising edge of input signal $IN_F$). In the rising-edge trigger delay cell 460, capacitor $C_R$ needs to be pre-charged after the non-triggering edge of input signal $IN_R$ (e.g., after the falling edge of input signal $IN_R$). Without the respective capacitors discharged (or pre-charged), the desired offset time delays may not be reached during subsequent triggering-edge cycles.

Figure 5A:
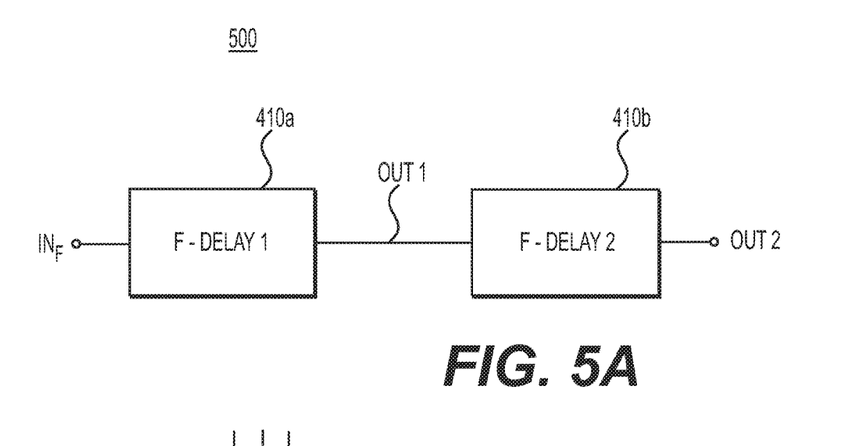
FIG. 5A depicts a schematic diagram of a falling-edge trigger delay cells, according to another aspect of the present disclosure.
Figure 5B:
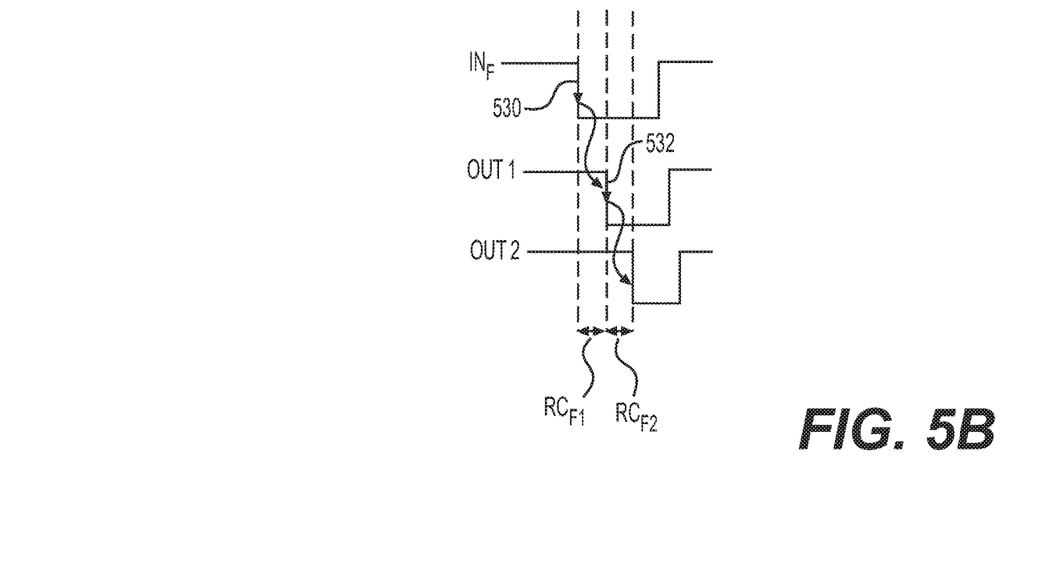
FIG. 5B depicts an example timing diagram of falling-edge triggered delayed output signals, according to another aspect of the present disclosure.

With reference now to FIG. 5A, there is depicted an asynchronous clock generating circuit 500, in which a first falling-edge delay cell 410a may be connected in series to a second falling-edge delay cell 410b. In some embodiments, the series-connected falling-edge delays cells may be configured to generate a cascading delay of asynchronous output signals, $OUT_1$ and $OUT_2$. As discussed above with reference to FIGS. 4A-4B, the first falling-edge delay cell 410a may be configured to offset an input signal $IN_F$ to generate the first output signal $OUT_1$. A second falling-edge delay cell 410b may be configured to offset the first output signal $OUT_1$ to generate the second output signal $OUT_2$. FIG. 5B is a corresponding timing diagram for the asynchronous clock generating circuit 500, in which cascading output signals, $OUT_1$ and $OUT_2$, are generated by offsetting input signal $IN_F$. The first output signal $OUT_1$ may be offset from a falling edge of input signal $IN_F$ (530) by a time delay $t=RC_{F1}$. The second output signal $OUT_2$ may be offset from a falling edge of the first output signal $OUT_1$ (532) by a time delay $t=RC_{F2}$.

As discussed above with reference to FIGS. 4A-4B, the capacitors in each of the falling-edge trigger delays cells, 410a and 410b, need to be discharged after the non-triggering edge of input signal $IN_F$ in order to reach the desired offset delays, $RC_{F1}$ and $RC_{F2}$. If the discharge period is too long, then some dead time may need to be built-in or otherwise accounted for to allow for the capacitors to discharge if the asynchronous timing signals are to be relied on with the expected offset delay times. Moreover, the capacitors may not begin their respective discharge periods until after each of the falling-edge delays, $OUT_1$ and $OUT_2$. Any dead time built-in for the capacitors to discharge may not be suitable for embedded-MRAM applications, in which back-to-back access operations (e.g., reading and/or writing) may occur without overhead operations.

In one aspect, the present disclosure may be directed to generating dual-edge triggered asynchronous timing signals for back-to-back access (e.g., reading and/or writing) operations in embedded-MRAM applications.

Figure 6A:
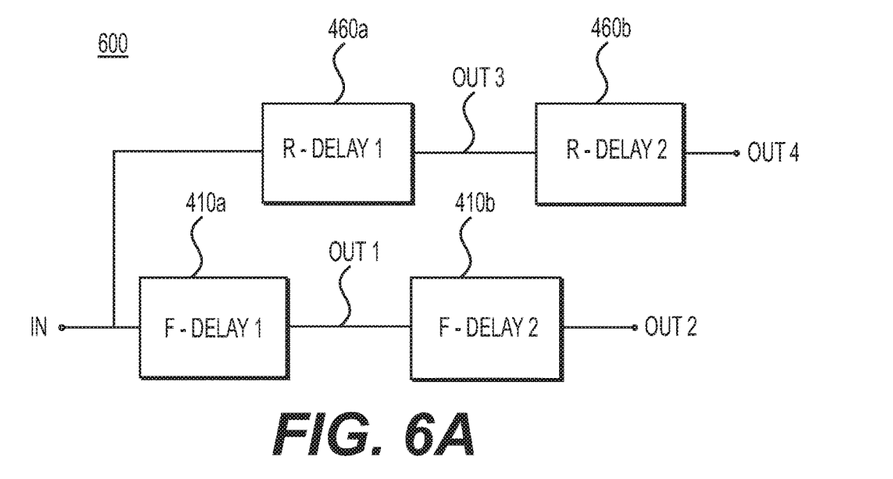
FIG. 6A depicts a schematic diagram of an asynchronous clock generating circuit with falling-edge and rising-edge trigger delay cells, according to another of the present disclosure.
Figure 6B:
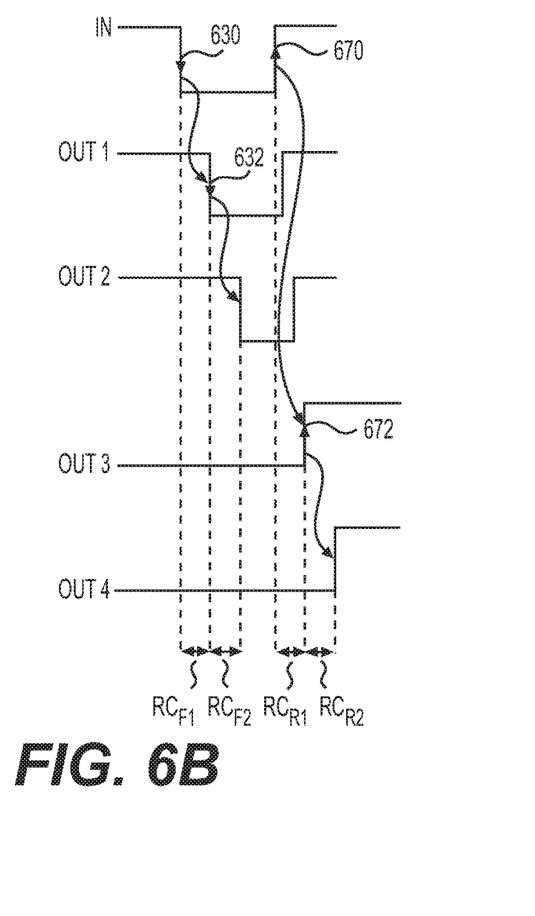
FIG. 6B depicts an example timing diagram of falling-edge and rising-edge triggered delayed output signals, according to another aspect of the present disclosure.

With reference now to FIG. 6A, there is depicted an embodiment of an asynchronous clock generating circuit 600, in which an input timing signal generates an asynchronous cascade of output delay signals $OUT_1$, $OUT_2$, $OUT_3$, and $OUT_4$. A first falling-edge delay cell 410a may be connected in series to a second falling-edge delay cell 410b. The series-connected falling-edge delays cells 410a, 410b may be configured to generate a cascading delay of asynchronous output signals, $OUT_1$ and $OUT_2$, respectively. As discussed above with reference to FIGS. 4A-4B, for example, the first falling-edge delay cell 410a may be configured to offset an input signal IN to generate the first output signal $OUT_1$. A second falling-edge delay cell 410b offsets the first output signal $OUT_1$ to generate the second output signal $OUT_2$. FIG. 6B is a corresponding timing diagram for the asynchronous clock generating circuit 600, in which cascading output signals, $OUT_1$ and $OUT_2$, may be generated by offsetting input signal IN. The first output signal $OUT_1$ may be offset from a falling edge of input signal IN (630) by a time delay $t=RC_{F1}$. The second output signal $OUT_2$ may be offset from a falling edge of the first output signal $OUT_1$ (632) by a time delay $t=RC_{F2}$.

The asynchronous clock generating circuit 600 may further include a first rising-edge delay cell 460a connected in series to a second rising-edge delay cell 460b. The series-connected rising-edge delay cells, 460a and 460b, may be configured to generate a cascading delay of asynchronous output signals, $OUT_3$ and $OUT_4$. As discussed above with reference to FIGS. 4C-4D, the first rising-edge delay cell 460a may be configured to offset an input signal IN to generate a third output signal $OUT_3$. A second rising-edge delay cell 460b may be configured to offset the third output signal $OUT_3$ to generate a fourth output signal $OUT_4$. As shown in FIG. 6B, the third output signal $OUT_3$ may be offset from a rising edge of input signal IN (670) by a time delay $t=RC_{R1}$. The fourth output signal $OUT_4$ may be offset from a rising edge of the third output signal $OUT_3$ (672) by a time delay $t=RC_{R2}$.

The asynchronous timing signals, $OUT_1$, $OUT_2$, $OUT_3$, and $OUT_4$, may be better suited for embedded-MRAM applications in which back-to-back access operations (e.g., reading and/or writing) may occur without overhead operations (such as, e.g., ACTIVATE or PRECHARGE operations). With the asynchronous clock generating circuit 600, the capacitors in each of the edge-triggered delay cells may be discharged (or pre-charged) without building in any dead time. For example, the capacitors in rising-edge trigger delay cells, 460a and 460b, may be discharged during the falling-edge periods of falling-edge delay cells, 410a and 410b. Similarly, the capacitors in falling-edge trigger delays cells, 410a and 410b, may be pre-charged during the rising-edge periods of rising-edge delay cells, 460a and 460b. Any suitable combination of logic operations (e.g., NAND, NOR) may be combined with the asynchronous timing signals, $OUT_1$, $OUT_2$, $OUT_3$, and $OUT_4$, to generate appropriate timing pulses for back-to-back access operations (e.g., reading and/or writing operations) in embedded-MRAM applications.

Figure 7A:
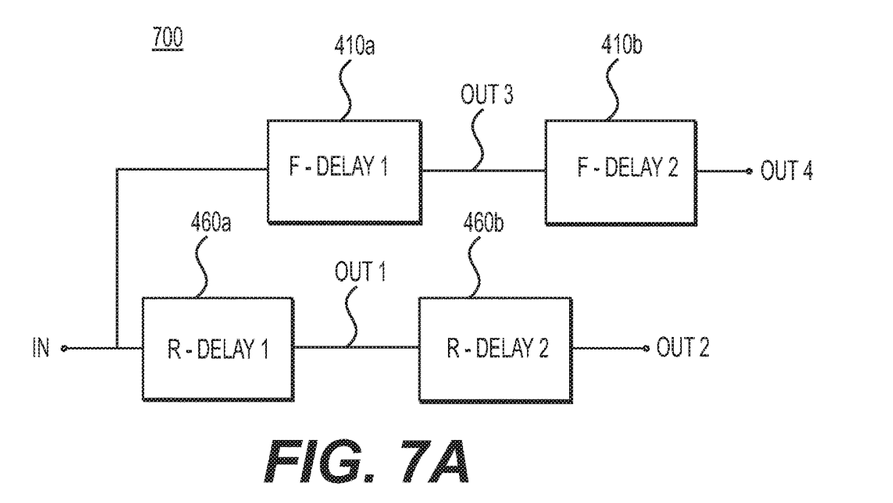
FIG. 7A depicts a schematic diagram of an asynchronous clock generating circuit with rising-edge and falling-edge trigger delay cells, according to another aspect of the present disclosure.
Figure 7B:
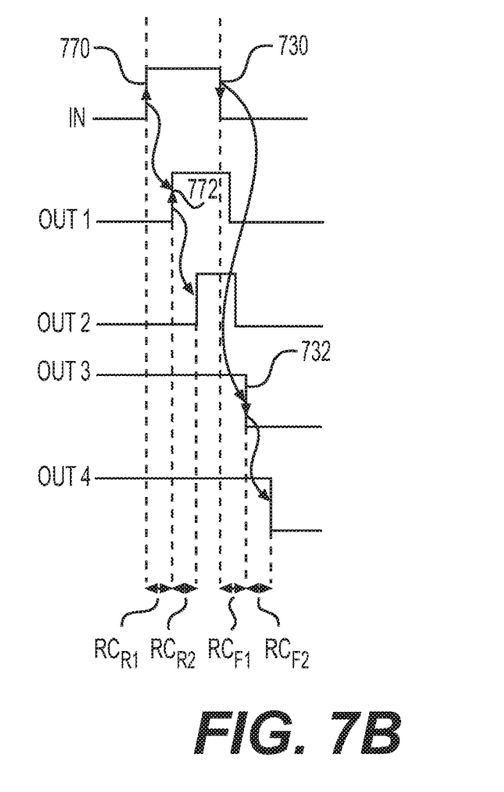
FIG. 7B depicts an example timing diagram of rising-edge and falling-edge triggered delayed output signals, according to another aspect of the present disclosure.

With reference now to FIG. 7, there is depicted another embodiment of an asynchronous clock generating circuit 700, in which an input timing signal generates an asynchronous cascade of output delay signals, $OUT_1$, $OUT_2$, $OUT_3$, and $OUT_4$. A first rising-edge delay cell 460a may be connected in series to a second falling-edge delay cell 460b. The series-connected falling-edge delays cells, 460a and 460b, may be configured to generate a cascading delay of asynchronous output signals, $OUT_1$ and $OUT_2$, respectively As discussed above with reference to FIGS. 4C-4D, the first rising-edge delay cell 460a may be configured to offset an input signal IN to generate a first output signal $OUT_1$. A second rising-edge delay cell 460b may be configured to offset the first output signal $OUT_1$ to generate a second output signal $OUT_2$. FIG. 7B is a corresponding timing diagram for the asynchronous clock generating circuit 700, in which cascading output signals, $OUT_1$ and $OUT_2$, are generated by offsetting input signal IN. The first output signal $OUT_1$ may be offset from a rising edge of input signal IN (770) by a time delay $t=RC_{R1}$. The second output signal $OUT_2$ may be offset from a rising edge of the first output signal $OUT_1$ (772) by a time delay $t=RC_{R2}$.

The asynchronous clock generating circuit 700 may further include a first falling-edge delay cell 410a connected in series to a second falling-edge delay cell 410b. The series-connected falling-edge delays cells, 410a and 410b, may be configured to generate a cascading delay of asynchronous output signals, $OUT_3$ and $OUT_4$, respectively As discussed above with reference to FIGS. 4A-4B, the first falling-edge delay cell 410a may be configured to offset an input signal IN to generate a third output signal $OUT_3$. A second falling-edge delay cell 410b may be configured to offset the third output signal $OUT_3$ to generate a fourth output signal $OUT_4$. As shown in FIG. 7B, the third output signal $OUT_3$ may be offset from a falling edge of input signal IN (730) by a time delay $t=RC_{F1}$. The fourth output signal $OUT_4$ may be offset from a falling edge of the third output signal $OUT_3$ (732) by a time delay $t=RC_{F2}$.

As discussed above with reference to FIGS. 6A-6B, the asynchronous timing signals, $OUT_1$, $OUT_2$, $OUT_3$, and $OUT_4$, may be better suited for embedded-MRAM applications in which back-to-back access operations (e.g., reading and/or writing) may occur without overhead operations (such as, e.g., ACTIVATE or PRECHARGE operations). With the asynchronous clock generating circuit 700, the capacitors in each of the edge-triggered delay cells may be discharged (or pre-charged) without building in any dead time. For example, the capacitors in rising-edge trigger delay cells, 460a and 460b, may be discharged during the falling-edge periods of falling-edge delay cells 410a and 410b. Similarly, the capacitors in falling-edge trigger delays cells, 410a and 410b, may be pre-charged during the rising-edge periods of rising-edge delay cells 460a and 460b. Any suitable combination of logic operations (e.g., NAND, NOR) may be combined with the asynchronous timing signals, $OUT_1$, $OUT_2$, $OUT_3$, and $OUT_4$, to generate appropriate timing pulses for back-to-back access operations (e.g., reading and/or writing operations) in embedded-MRAM applications.

Figure 8A:
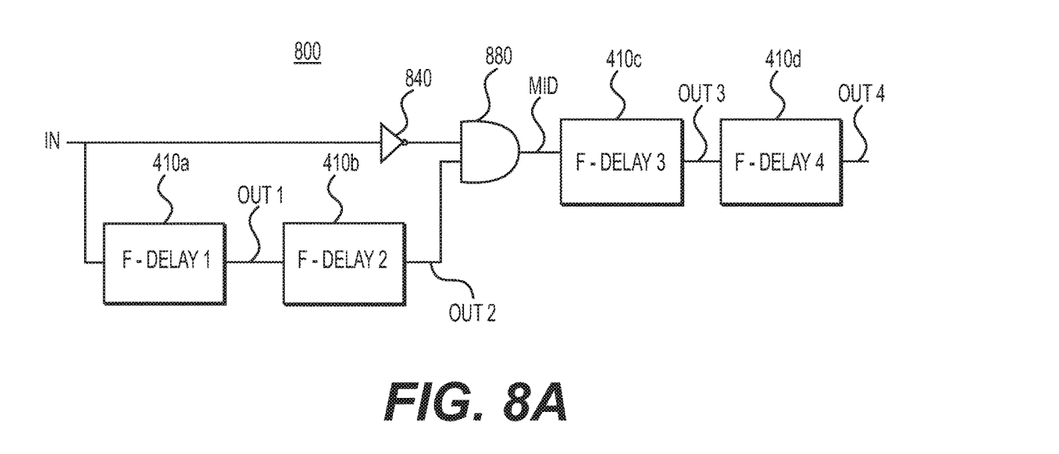
FIG. 8A depicts a schematic diagram of an asynchronous clock generating circuit with falling-edge trigger delay cells, according to another aspect of the present disclosure.
Figure 8B:
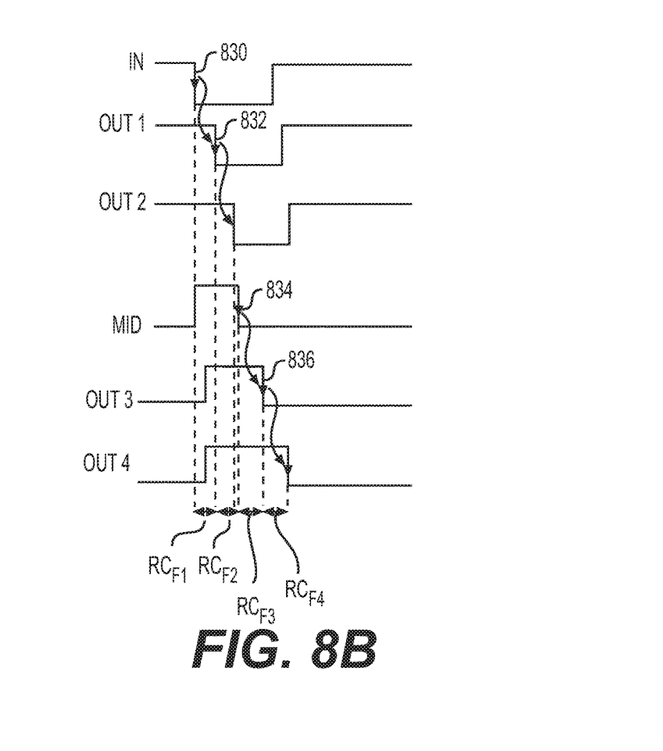
FIG. 8B depicts an example timing diagram of falling-edge and rising-edge triggered delayed output signals, according to another aspect of the present disclosure.

With reference now to FIG. 8, there is depicted another embodiment of an asynchronous clock generating circuit 800, in which a combination of falling-edge delay cells, 410a-410d, generates an asynchronous cascade of output delay signals $OUT_1$, $OUT_2$, $OUT_3$, and $OUT_4$, respectively A first falling-edge delay cell 410a may be connected in series to a second falling-edge delay cell 410b. The series-connected falling-edge delays cells may be configured to generate a cascading delay of asynchronous output signals, $OUT_1$ and $OUT_2$. As discussed above with reference to FIGS. 4A-4B, the first falling-edge delay cell 410a may be configured to offset an input signal IN to generate a first output signal $OUT_1$. A second falling-edge delay cell 410b may be configured to offset the first output signal $OUT_1$ to generate a second output signal $OUT_2$. FIG. 8B is a corresponding timing diagram for the asynchronous clock generating circuit 800, in which cascading output signals, $OUT_1$ and $OUT_2$, may be generated by offsetting input signal IN. The first output signal $OUT_1$ may be offset from a falling edge of input signal IN (830) by a time delay $t=RC_{F1}$. The second output signal $OUT_2$ may be offset from a falling edge of the first output signal $OUT_1$ (832) by a time delay $t=RC_{F2}$.

The asynchronous clock generating circuit 800 may further include a third falling-edge delay cell 410c connected in series to a fourth falling-edge delay cell 410d. The series-connected falling-edge delay cells may be configured to generate a cascading delay of asynchronous output signals, $OUT_3$ and $OUT_4$. In some embodiments, the input signal to falling-edge delay cell 410c is a MID signal (e.g., midpoint signal) that may be an output signal from an AND operator 880. One input to the AND operator 880 is an inverted signal of input signal IN (output from inversion device 840), and another input to the AND operator 880 is the output timing signal $OUT_2$. As discussed above with reference to FIGS. 4A-4B, the first falling-edge delay cell 410c may be configured to offset the MID signal to generate a third output signal $OUT_3$. A second falling-edge delay cell 410d may be configured to offset the third output signal $OUT_3$ to generate a fourth output signal $OUT_4$. As shown in FIG. 8B, the third output signal $OUT_3$ may be offset from a falling edge of input signal IN (830) by a time delay $t=RC_{F1}$. The fourth output signal $OUT_4$ may be offset from a falling edge of the third output signal $OUT_3$ (832) by a time delay $t=RC_{F2}$.

As discussed above with reference to FIGS. 6A-6B, the asynchronous timing signals, $OUT_1$, $OUT_2$, $OUT_3$, and $OUT_4$, may be better suited for embedded-MRAM applications in which back-to-back access operations (e.g., reading and/or writing) may occur without overhead operations (such as, e.g., ACTIVATE or PRECHARGE operations). With the asynchronous clock generating circuit 800, the capacitors in each of the edge-triggered delay cells may be pre-charged without building in any dead time. For example, the capacitors in falling-edge trigger delay cells, 410c and 410d, may be precharged during the falling-edge periods of falling-edge delay cells 410a and 410b. Similarly, the capacitors in falling-edge trigger delays cells, 410a and 410b, may be pre-charged during the falling-edge periods of falling-edge delay cells 410c and 410d. Furthermore, the AND operator 880 enables auto-triggering of the falling-edge delay cells 410c and 410d. The MID signal goes low after OUT2 goes low following the delays from falling-edge delay cells 410a and 410b. Any suitable combination of logic operations (e.g., NAND, NOR) may be combined with the asynchronous timing signals, $OUT_1$, $OUT_2$, $OUT_3$, and $OUT_4$, to generate appropriate timing pulses for back-to-back access operations (e.g., reading and/or writing operations) in embedded-MRAM applications.

Figure 9:
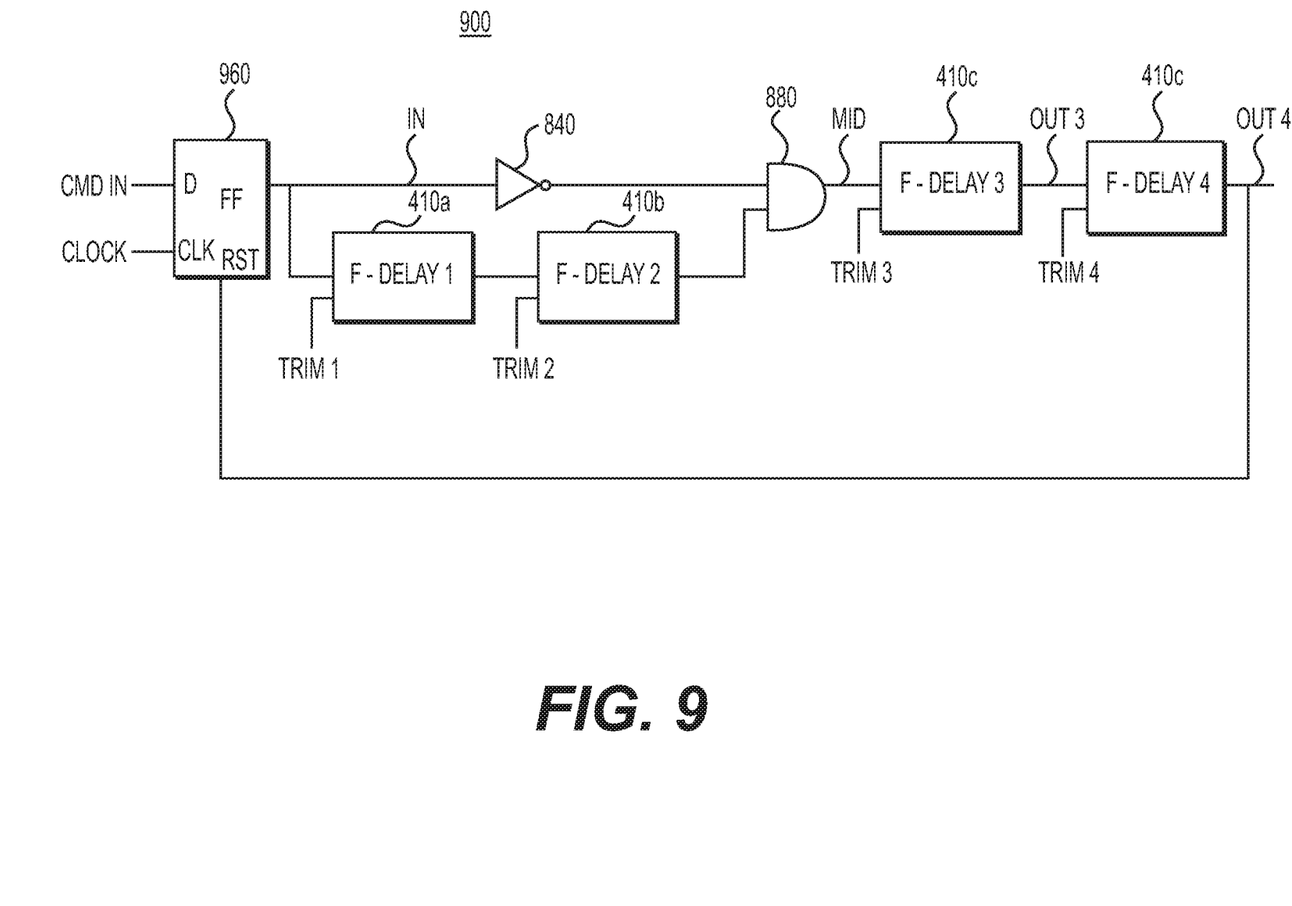
FIG. 9 depicts a schematic diagram of an asynchronous clock generating circuit, according to another of the present disclosure.

With reference now to FIG. 9, there is depicted another embodiment of an asynchronous clock generating circuit 900. A flip-flop 960 may be configured to generate input signal IN from an input command signal CMD IN. In some embodiments, flip-flop 960 may generate input signal IN from input command signal CMD IN during an edge trigger of a clock signal CLOCK. In other embodiments, flip-flop 960 may be configured to provide a self-reset option for the asynchronous clock generating circuit 900. For example, output delay signal $OUT_4$ may be configured to provide an edge trigger for resetting flip-flop 960. However, it is to be appreciated that any of the output delay signals, $OUT_1$, $OUT_2$, $OUT_3$, and $OUT_4$, may be configured to provide the self-reset option for the asynchronous clock generating circuit 900.

For each of the falling-edge delay cells, 410a-410d, the RC time delays may be defined by selecting among a range of variable capacitance values. For example, each of the falling-edge delays cells, 410a-410d, may include a TRIM input to select among an incremental range of variable capacitance values. Capacitance values may incrementally be selected to extend the RC time delays in, e.g., half nanosecond increments, by multiples of two (e.g., a first capacitor may add a half nanosecond; a second capacitor may add one nanosecond; a third capacitor may add two nanoseconds, etc.). In some embodiments, the RC time delays may be varied incrementally to range from half a nanosecond to four nanoseconds.

It is to be appreciated that any suitable combination of logic operations (e.g., NAND, NOR) may be combined with the asynchronous timing signals, $OUT_1$, $OUT_2$, $OUT_3$, and $OUT_4$, to generate appropriate timing pulses for back-to-back access operations (e.g., reading and/or writing operations) in embedded-MRAM applications. For example, during a read phase, output delays signals $OUT_1$ and $OUT_2$ may be configured to determine phase timing for address decoding, redundancy matching, and for row/column selection in the magnetic memory device. Output delay signal $OUT_3$ may be configured to determine the pre-amplifier signal development timing phase of the sense amplifier. Alternatively, more delay stages may be added in series with output delays signal $OUT_3$ for other phases during read operations.

During a write phase, output delays signals $OUT_1$ and $OUT_2$ may be configured to determine phase timing for address decoding, redundancy matching, error correction code (ECC) calculations, and for wordline/bitline selections in the magnetic memory device. In an another example, output delay signals $OUT_3$ may be configured to determine a write-pulse width. In yet another example, output delay signal $OUT_4$ may be configured to determine a wordline-off timing.

In an alternate embodiment, a circuit may comprise a first clock-generating circuit and a second clock-generating circuit. The first clock-generating circuit may be configured to receive an input clock signal, and may include a first falling-edge trigger delay cell connected in series with a second falling-edge trigger delay cell. The first falling-edge trigger delay cell may be configured to provide a first output signal. The second falling-edge trigger delay cell may be configured to provide a second output signal, and the first output signal may be offset from the input clock signal by a first time delay. The second output signal may be offset from the first output signal by a second time delay. The second clock-generating circuit may be configured to receive the input clock signal, and may include a first rising-edge trigger delay cell connected in series with a second rising-edge trigger delay cell. The first rising-edge trigger delay cell may be configured to provide a third output signal, and the second rising-edge trigger delay cell may be configured to provide a fourth output signal. The third output signal may be offset from the input clock signal by a third time delay, and the fourth output signal may be offset from the third output signal by a fourth time delay. The first output signal, the second output signal, the third output signal, and the fourth output signal may be configured for controlling clocking operations.

In another alternate embodiment, a circuit may comprise a first group of delay cells and second group of delay cells. The first group of delay cells may be configured to: receive an input signal, generate a first output signal and a second output signal, offset the input signal by a first time delay to generate the first output signal, and offset the first output signal by a second time delay to generate the second output signal. The second group of delays cells may be configured to: receive the input signal, generate a third output signal and a fourth output signal, offset the input signal by a third time delay to generate the third output signal, and offset the third output signal by a fourth time delay to generate the fourth output signal. The third and fourth output signals may be generated while the first group of delay cells undergoes a precharge operation.

In another alternate embodiment, a circuit may comprise a first group of delay cells and second group of delay cells. The first group of delay cells may be configured to: receive an input signal, generate a first output signal and a second output signal, offset the input signal by a first time delay to generate the first output signal, and offset the first output signal by a second time delay to generate the second output signal. The second group of delays cells may be configured to: receive the input signal, generate a third output signal and a fourth output signal, offset the input signal by a third time delay to generate the third output signal, and offset the third output signal by a fourth time delay to generate the fourth output signal. The third and fourth output signals may be generated while the first group of delay cells undergoes a discharge operation.

While exemplary embodiments have been presented above, it should be appreciated that many variations exist. Furthermore, while the description uses spin-torque MRAM devices that include memory cells in a specific example arrangements, the teachings may be applied to other memory devices having different architectures in which the same concepts can be applied. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

The foregoing description of the inventions has been described for purposes of clarity and understanding. It is not intended to limit the inventions to the precise form disclosed. Various modifications may be possible within the scope and equivalence of the application.

We claim:

1. A magnetoresistive memory, comprising:
a first memory cell that includes:
   a first select device;
   a first magnetoresistive memory element coupled in series with the first select device;
   a second select device; and
   a second magnetoresistive memory element coupled in series with the second select device, wherein the first memory cell is configured to store a single bit by storing complementary states in the first and second magnetoresistive elements;
a first clock-generating circuit, wherein the first clock-generating circuit is configured to receive an input clock signal, wherein the first clock-generating circuit includes a first falling-edge trigger delay cell connected in series with a second falling-edge trigger delay cell, wherein the first falling-edge trigger delay cell is configured to provide a first output signal, wherein the second falling-edge trigger delay cell is configured to provide a second output signal, wherein the first output signal is offset from the input clock signal by a first time delay, and the second output signal is offset from the first output signal by a second time delay; and
a second clock-generating circuit, wherein the second clock-generating circuit is configured to receive the input clock signal, wherein the second clock-generating circuit includes a first rising-edge trigger delay cell connected in series with a second rising-edge trigger delay cell, wherein the first rising-edge trigger delay cell is configured to provide a third output signal, wherein the second rising-edge trigger delay cell is configured to provide a fourth output signal, wherein the third output signal is offset from the input clock signal by a third time delay, and the fourth output signal is offset from the third output signal by a fourth time delay, wherein the first output signal, the second output signal, the third output signal, and the fourth output signal are configured for controlling access operations for the first memory cell.

2. The magnetoresistive memory of claim 1, wherein each of the first and second magnetoresistive memory element is a magnetic tunnel junction.

3. The magnetoresistive memory of claim 1, wherein the access operations include one of a read operation and write operation.

4. The magnetoresistive memory of claim 1, wherein the first, second, third, and fourth output signals are asynchronous clock signals.

5. The magnetoresistive memory of claim 1, wherein the first, second, third, and fourth output signals are configured to provide a self-reset option for any one of the first and second clock-generating circuits.

6. The magnetoresistive memory of claim 1, wherein each of the first and second falling-edge trigger delay cells include a TRIM input to select among an incremental range of variable capacitance values.

7. The magnetoresistive memory of claim 1, wherein each of the first and second rising-edge trigger delay cells include a TRIM input to select among an incremental range of variable capacitance values.

8. A magnetoresistive memory, comprising:
a first memory cell that includes:
   a first select device;
   a first magnetoresistive memory element coupled in series with the first select device;
   a second select device; and
   a second magnetoresistive memory element coupled in series with the second select device, wherein the first memory cell is configured to store a single bit by storing complementary states in the first and second magnetoresistive memory elements;
a first clock-generating circuit, wherein the first clock-generating circuit is configured to receive an input clock signal, wherein the first clock-generating circuit includes a first rising-edge trigger delay cell connected in series with a second rising-edge trigger delay cell, wherein the first rising-edge trigger delay cell is configured to provide a first output signal, wherein the second falling-edge trigger delay cell is configured to provide a second output signal, wherein the first output signal is offset from the input clock signal by a first time delay, and the second output signal is offset from the first output signal by a second time delay; and
a second clock-generating circuit, wherein the second clock-generating circuit is configured to receive the input clock signal, wherein the second clock-generating circuit includes a first falling-edge trigger delay cell connected in series with a second falling-edge trigger delay cell, wherein the first falling-edge trigger delay cell is configured to provide a third output signal, wherein the second falling-edge trigger delay cell is configured to provide a fourth output signal, wherein the third output signal is offset from the input clock signal by a third time delay, and the fourth output signal is offset from the third output signal by a fourth time delay, wherein the first output signal, the second output signal, the third output signal, and the fourth output signal are configured for controlling access operations for the first memory cell.

9. The magnetoresistive memory of claim 8, wherein each of the first and second magnetoresistive memory element is a magnetic tunnel junction.

10. The magnetoresistive memory of claim 8, wherein the access operations include one of a read operation and write operation.

11. The magnetoresistive memory of claim 8, wherein the first, second, third, and fourth output signals are asynchronous clock signals.

12. The magnetoresistive memory of claim 8, wherein the first, second, third, and fourth output signals are configured to provide a self-reset option for any one of the first and second clock-generating circuits.

13. The magnetoresistive memory of claim 8, wherein each of the first and second falling-edge trigger delay cells include a TRIM input to select among an incremental range of variable capacitance values.

14. The magnetoresistive memory of claim 8, wherein each of the first and second rising-edge trigger delay cells include a TRIM input to select among an incremental range of variable capacitance values.

15. A magnetoresistive memory, comprising:
a first memory cell that includes:
   a first select device;
   a first magnetoresistive memory element coupled in series with the first select device;
   a second select device; and
   a second magnetoresistive memory element coupled in series with the second select device, wherein the first memory cell is configured to store a single bit by storing complementary states in the first and second magnetoresistive memory elements;
a first clock-generating circuit, wherein the first clock-generating circuit is configured to receive an input clock signal, wherein the first clock-generating circuit includes a first rising-edge trigger delay cell connected in series with a second rising-edge trigger delay cell, wherein the first rising-edge trigger delay cell is configured to provide a first output signal, wherein the second falling-edge trigger delay cell is configured to provide a second output signal, wherein the first output signal is offset from the input clock signal by a first time delay, and the second output signal is offset from the first output signal by a second time delay;

a second clock-generating circuit, wherein the second clock-generating circuit is configured to receive the input clock signal, wherein the second clock-generating circuit includes a first falling-edge trigger delay cell connected in series with a second falling-edge trigger delay cell, wherein the first falling-edge trigger delay cell is configured to provide a third output signal, wherein the second falling-edge trigger delay cell is configured to provide a fourth output signal, wherein the third output signal is offset from the input clock signal by a third time delay, and the fourth output signal is offset from the third output signal by a fourth time delay, wherein the first output signal, the second output signal, the third output signal, and the fourth output signal are configured for controlling access operations for the first memory cell;

and a reset device, wherein the reset device is configured to reset the input signal based on the fourth output signal.

16. The magnetoresistive memory of claim 15, wherein each of the first and second magnetoresistive memory element is a magnetic tunnel junction.

17. The magnetoresistive memory of claim 15, wherein the access operations include one of a read operation and write operation.

18. The magnetoresistive memory of claim 15, wherein the first, second, third, and fourth output signals are asynchronous clock signals.

19. The magnetoresistive memory of claim 15, wherein the first, second, third, and fourth output signals are configured to provide a self-reset option for any one of the first and second clock-generating circuits.

20. The magnetoresistive memory of claim 15, wherein each of the first and second falling-edge trigger delay cells include a TRIM input to select among an incremental range of variable capacitance values.

* * * * *